United States Patent
Fresia et al.

(10) Patent No.: US 8,910,029 B2
(45) Date of Patent: Dec. 9, 2014

(54) ITERATIVE DECODER

(75) Inventors: Maria Fresia, Munich (DE); Jens Berkmann, Munich (DE); Axel Huebner, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 394 days.

(21) Appl. No.: 13/022,775

(22) Filed: Feb. 8, 2011

(65) Prior Publication Data

US 2012/0204081 A1 Aug. 9, 2012

(51) Int. Cl.
*H03M 13/39* (2006.01)
*H03M 13/37* (2006.01)
*H03M 13/29* (2006.01)

(52) U.S. Cl.
CPC ...... *H03M 13/3972* (2013.01); *H03M 13/3723* (2013.01); *H03M 13/296* (2013.01)
USPC .............................. 714/796; 714/763; 714/792

(58) Field of Classification Search
CPC ....................... H03M 13/4107; H03M 13/3961
USPC .......... 714/796, 763, 792, 755, 769, 780, 795
See application file for complete search history.

(56) References Cited

U.S. PATENT DOCUMENTS

| | | | | |
|---|---|---|---|---|
| 7,200,799 B2 * | 4/2007 | Wang et al. | | 714/795 |
| 7,346,833 B2 * | 3/2008 | Hagh et al. | | 714/780 |
| 7,584,407 B2 * | 9/2009 | Kim | | 714/794 |
| 7,584,409 B2 | 9/2009 | Orio | | |
| 7,836,376 B2 * | 11/2010 | Berens | | 714/763 |
| 7,849,377 B2 * | 12/2010 | Hekstra et al. | | 714/752 |
| 2002/0097816 A1 * | 7/2002 | Sim | | 375/341 |
| 2003/0101402 A1 * | 5/2003 | Amrani et al. | | 714/755 |

FOREIGN PATENT DOCUMENTS

| KR | 1020027014808 A | 1/2003 |
|---|---|---|
| KR | 1020060040789 A | 10/2006 |
| KR | 100761306 B1 | 9/2007 |

OTHER PUBLICATIONS

C. Berrou, et al., "Near Shannon Limit Error-Correcting Coding and Decoding: Turbo Codes", Proc. of the IEEE International Conference on Communication, Geneva, p. 1064-1070, May 1993.
L. Bahl, et al., "Optimal Decoding of Linear Codes for Minimizing Symbol Error Rate", IEEE Transactions on Information Theory, vol. IT 20, No. 2, p. 284-287, Mar. 1974.
P. Robertson, et al., "A Comparison of Optimal and Sub-Optimal MAP Decoding Algorithms Operating in the Log Domain", Proc. of the IEEE International Conference on Communications (ICC '95), Seattle, p. 1009-1013, Jun. 1995.
C. Benkeser, et al., "Design and Optimization of an HSDPA Turbo Decoder ASIC", IEEE Journal of Solid-State Circuits, vol. 44, No. 1, p. 98-106, Jan. 2009.

(Continued)

*Primary Examiner* — Fritz Alphonse
(74) *Attorney, Agent, or Firm* — Eschweiler & Associates, LLC

(57) ABSTRACT

An iterative decoder for decoding a code block comprises a computation unit configured to perform forward and backward recursions over a code block or a code sub-block in each decoding iteration. A first forward/backward decoding scheme is used in a first iteration and a second forward/backward decoding scheme is used in a second iteration. The first and second decoding schemes are different in view of forward and backward processing.

23 Claims, 8 Drawing Sheets

(56) References Cited

OTHER PUBLICATIONS

O. Muller, et al., "From Parallelism Levels to a Multi-ASIP Architecture for Turbo Decoding", IEEE Transactions on Very Large Scale Integration (VLSI) Systems, vol. 17, No. 1, p. 92-102, Jan. 2009.

S. Kim, et al., "A Memory-Efficient Blockwise Map Decoder Architecture", ETRI Journal, vol. 26, No. 6, p. 615-621, Dec. 2004.

M. May, et al., "A 150Mbit/s 3GPP LTE Turbo Code Decoder", Proc. of the IEEE Design, Automation and Test in Europe Conference and Exhibition (DATE) 2010, Dresden, p. 1420-1425, Mar. 2010.

A. Dingninou, et al., "Organization de la Memorie dans un Turbo Decodeur Utilisant L'Algorithme", SUBMAP, in GRETSV99, p. 71-74, Vannes France, Sep. 1999.

* cited by examiner

ITERATIVE DECODER

BACKGROUND

The invention relates to iterative decoding, and more particularly to the technique of iterative decoding a code block using forward and backward recursions.

Forward error correction (FER) codes such as turbo codes, for example, are used in many of today's communication devices because of their high error correction capabilities. Unfortunately, however iterative decoding of an FER code in a decoder using forward and backward recursions may require a large amount of memory and/or complex hardware, and may lead to computational expense and latency.

Several approaches are known to improve the performance of an iterative decoder. Max-Log-MAP algorithms are used to reduce the computational complexity. The sliding window technique may be applied to limit the amount of stored data and to reduce latency. Parallel decoder architectures allow for high throughput. Notwithstanding, the reduction of memory space, latency and computational effort remains an ongoing challenge.

For these and other reasons there is a need for the present invention.

BRIEF DESCRIPTION OF THE DRAWINGS

The accompanying drawings are included to provide a further understanding of embodiments and are incorporated in and constitute part of this specification. The drawings illustrate embodiments and together with the description serve to explain principles of embodiments. Other embodiments and many of the intended advantages of embodiments will be readily appreciated as they will become better understood by reference to the following detailed description. Like reference numerals designate corresponding similar parts.

DETAILED DESCRIPTION

Figure 1:
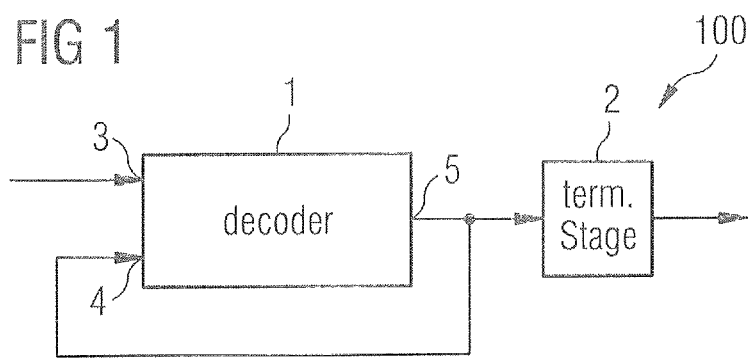
FIG. 1 is block diagram illustrating an embodiment of an iterative decoder for decoding a code.

In the following detailed description, reference is made to the accompanying drawings, which form a part thereof, and in which are shown by way of illustration specific embodiments in which the invention may be practiced. In the drawings, like reference numerals are generally utilized to refer to like elements throughout the description. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. In other instances, known structures and devices are shown in a simplified representation in order to facilitate describing one or more aspects of the embodiments of the invention. The following description is therefore not to be taken in a limiting sense, and the scope of the invention is defined by the appended claims.

The various aspects summarized may be embodied in various forms. The following description shows by way of illustration various combinations and configurations in which the aspects may be practiced. It is understood that the described aspects and/or embodiments are merely examples, and that other aspects and/or embodiments may be utilized and structural and functional modifications may be made without departing from the scope of the present disclosure. In particular, it is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The iterative decoders described herein may be employed in devices of wireless communication systems, in particular in receivers and transceivers. They may be employed in base stations as well as in mobile stations.

The iterative decoders described herein may be configured to decode any kinds of error correcting codes for which iterative decoding applying a forward recursion and a backward recursion may be used. In particular, the iterative decoders described herein may be configured to decode convolutional codes and/or concatenated codes, for instance, parallely concatenated convolutional codes such as turbo codes, for example. Such decoders may be used in telecommunications systems based on the UMTS (Universal Mobile Telecommunications System) standard, HSDPA (High Speed Downlink Packet Access) or HSUPA (High Speed Uplink Packet Access), and long term evolution (LTE), among others.

By way of example, FIG. 1 illustrates an embodiment of an iterative decoder 100. The iterative decoder 100 comprises a decoder 1 and a termination stage 2. The decoder 1 decodes code blocks received at an input 3 and has an output 5 to provide a sequence of reliability data representative of estimates of the originally transmitted (systematic) data bits. Further, the decoder 1 has an input 4 for a-priori information.

The decoder 1 decodes the code blocks received at input 3. Typically, a code block is represented by sequence of soft values which comprise systematic information and parity information. The systematic information corresponds to the original transmitted data sequence. The parity information corresponds to parity information generated by one or more encoders (e.g. convolutional encoders) at the transmitter.

In iterative decoding, decoding results such as, for example, the estimates provided at output 5 are fed back to the input 4 of decoder 1 and are used as a-priori information in the next decoding iteration. This iteration is continued until a maximum number of allowed iterations is reached or another stopping criterion is satisfied.

The estimates provided at output 5 are input into the termination stage 2. When the stopping criterion is satisfied, the iterative decoding process is stopped and the estimates of the systematic data are output from the termination stage 2. By way of example, a stopping criterion may be satisfied if a sufficient amount of convergence of estimates generated in consecutive iterations at output 5 is reached.

Decoder 1 may be designed as a symbol-by-symbol a-posteriori probability (APP) decoder. APP decoders operate on a trellis diagram. A trellis diagram is a representation of the encoder states versus discrete time. By way of example, decoder 1 may be designed as SISO (Soft-Input-Soft-Output) decoder.

Figure 2:
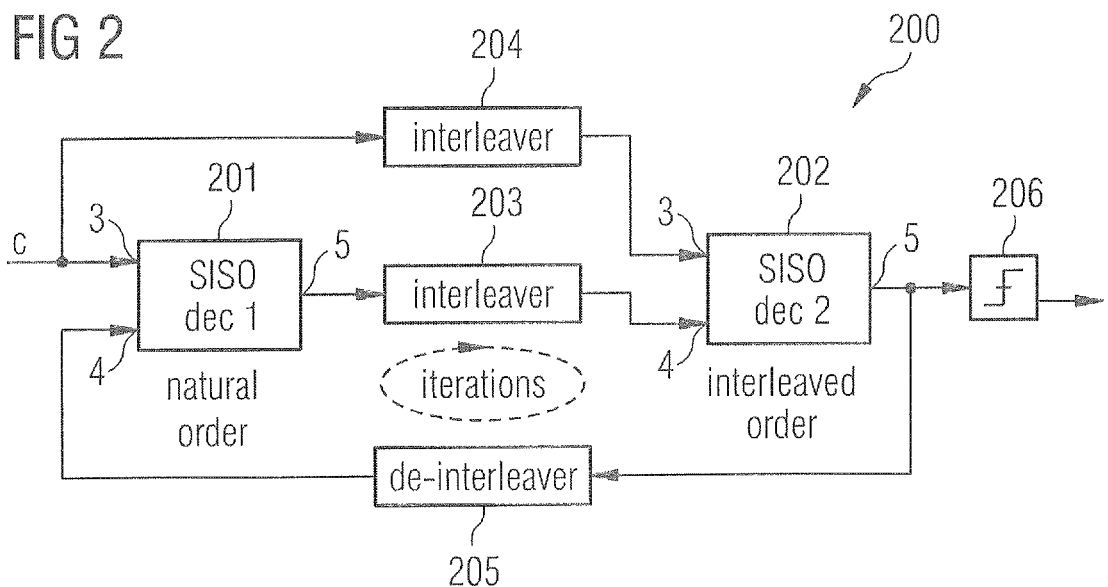
FIG. 2 is block diagram illustrating an embodiment of an iterative decoder for decoding a turbo code.

FIG. 2 illustrates the principle design of an iterative decoder 200 for decoding a turbo code. The iterative decoder 200 is designed according to the principles of iterative decoder 100 shown in FIG. 1. More specifically, iterative decoder 200 may comprise a first component decoder 201, a second component decoder 202 and an interleaver 203 coupled between an output of the first component decoder 201 and an input of the second component decoder 202. The first component decoder 201 and the second component decoder 202 may, for example, be designed as APP decoders, i.e. may be identical with decoder 1 in FIG. 1. By way of example, the first component decoder 201 and the second component decoder 202 may be designed as SISO decoders. Each SISO decoder 201, 202 estimates the symbol-by-symbol a-posteriori probability.

The iterative decoder 200 may further comprise an interleaver 204, a de-interleaver 205 and a termination stage 206. The termination stage 206 may be similar to the termination stage 2 in iterative decoder 100 of FIG. 1, and reference is made to the corresponding description.

The first component decoder 201 receives at input 3 systematic data and parity data produced by a turbo encoder in the transmitter and reconstructed by a demodulator (not shown) in the receiver. Since the signal received at the receiver is usually distorted by noise and interference, the demodulator can only provide estimates of the systematic data and parity data generated by the turbo encoder. Typically, these estimates are provided to the turbo decoder 200 in the form of log-likelihood ratios (LLRs). LLRs express the ratio between the probabilities of the transmitted bits being 0 and being 1, given the received analog signal.

The first component decoder 201 works on the sequence of systematic data and parity data received at input 3 in natural order. The first component decoder 201 computes a-posteriori probabilities of the transmitted systematic data from the LLRs of the systematic data and associated parity data received at input 3, and from the a-priori information received at input 4. The second component decoder 201 computes a-posteriori probabilities of the interleaved systematic data from the LLRs received at a-priori information input 4 and associated interleaved parity data received at input 3. Thus, the output of the interleaver 203 is used as a-priori information in the second component decoder 202.

In subsequent iterations each component decoder 201, 202 uses the so-called extrinsic information output by the other component decoder 201, 202 in the preceding half-iteration as a-priori information.

It is to be noted that FIG. 2 is a simplified block diagram of a turbo decoder. As known in the art, the first and second component decoders 201, 202 may work on different parts of code block data. By way of example, a received code block $c=(u, p_1, p_2)$ may comprise the systematic sequence u, a first parity sequence $p_1$ and a second parity sequence $p_2$, (wherein all these sequences are typically distorted by noise and interference). In this case, by way of example, the systematic sequence u and the first parity sequence $p_1$ may be used at the input 3 of the first component decoder 201, and the interleaved systematic sequence $u_T$ and the second parity sequence $p_2$ may be used at the input 3 of the second component decoder 201.

One algorithm to produce the APP is the so-called Bahl, Cocke, Jelinek, and Raviv (BCJR) algorithm. According to the theoretical BCJR algorithm, the APP decoder 1, 201, 202 computes forward metrics $\alpha$ and backward metrics 13 and then the output metrics (i.e. the sequence of reliability data; for decoder 1, this sequence corresponds to the estimates of the original transmitted data sequence). The $\alpha$- and $\beta$-metrics are gathered in a forward and backward recursion, respectively.

Figure 3:
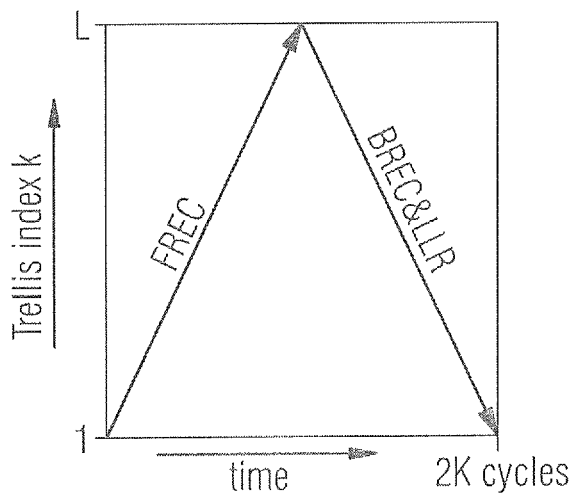
FIG. 3 is a diagram schematically illustrating a decoding scheduling comprising a forward recursion and a backward recursion.

FIG. 3 is a diagram illustrating a decoding scheduling comprising a forward recursion frec to first calculate the forward metrics $\alpha$ for the whole code block, a backward recursion brec to calculate the backward metrics $\beta$ for the whole code block and the output metrics, i.e. the probability values (LLRs) obtained at the output of decoder 1, 201, 202. As shown in FIG. 3, to reduce the latency and the memory required, the backward metrics $\beta$ and the output metrics (LLRs) may be computed at the same time. Here, the y-axis denotes the trellis index k running from 1 to L (length of data block) and the x-axis corresponds to the time in units of cycles.

As illustrated in FIG. 3, the forward recursion frec starts deterministically from the zero trellis state when using the BCJR algorithm. In addition, thanks to the so-called termination bits (i.e. selected bits added to the message systematic bits in order to force the trellis path to return back to the initial state), also the backward recursion brec may start deterministically from the zero state. These two measures, together with the forward and backward recursions frec, brec being performed on the whole code block, imply that the BCJR algorithm computes the best possible estimates for the transmitted data block given the received data. It is also possible that no termination bits are used in the BCJR algorithm. In this case, the optimal initialization of the backward recursion brec at the ending trellis state is a uniform distribution.

In one embodiment the decoders 1, 201, 202 may use the so-called Log-MAP algorithm, which is a simplified version of the BCJR algorithm. The Log-MAP algorithm basically performs the same operations as the BCJR algorithm but in the logarithmic domain, that is multiplications are substituted with additions. The Log-MAP algorithm yields the same performance as the BCJR algorithm but with reduced complexity.

In one embodiment the decoders 1, 201, 202 use the so-called Max-Log-MAP algorithm. The Max-Log-MAP algorithm is an approximated version of the Log-MAP algorithm.

The Max-Log-MAP algorithm operates in the logarithmic domain and avoids logarithmic and exponential operations at the expense of a few tenths of a dB degradation in error performance.

By way of example, in the Max-Log-MAP algorithm, the α- and β-metrics are computed in a forward and a backward recursion, respectively, according to $$\alpha_{k+1}^{(m')} = \max_{\forall m}\left(\alpha_k^{(m)} + \gamma_{k,k+1}^{m,m'}\right) \quad (1)$$

$$\beta_k^{(m)} = \max_{\forall m'}\left(\beta_{k+1}^{(m')} + \gamma_{k,k+1}^{m,m'}\right) \quad (2)$$

where max is a maximum selection. Here, the state metrics $\alpha_k^m$ and $\beta_{k+1}^{m'}$ refer to the encoder states at trellis index k and the branch metrics $\gamma_{k,k+1}^{m,m'}$ refer to state transitions m→m' between encoder states m and m'. Note that for a rate 1/n convolutional encoder one information symbol and n data symbols are associated with the index k.

In one embodiment the decoder 1, 201, 202 uses a sliding-window approach. The sliding-window approach serves to limit the amount of stored data and thus the memory space required in decoder 1, 201, 202. According to the sliding-window approach, the code block or, if parallel decoder architectures are used, a code sub-block is divided into several windows and a decoding algorithm such as e.g. Log-MAP or Max-Log-MAP is applied consecutively on each of the windows. While the forward recursion frec is typically unchanged with respect to the "perfect" implementation as explained in conjunction with FIG. 3, the backward recursion brec is performed window-wise and intermittently. Therefore, the window-based approach requires a state metric initialization at the border of each window for the backward recursion brec. As known in the art, the imperfectness of this initialization leads to some losses in performance of the window-based approach compared to the non-window-based approach shown in FIG. 3.

Figure 4:
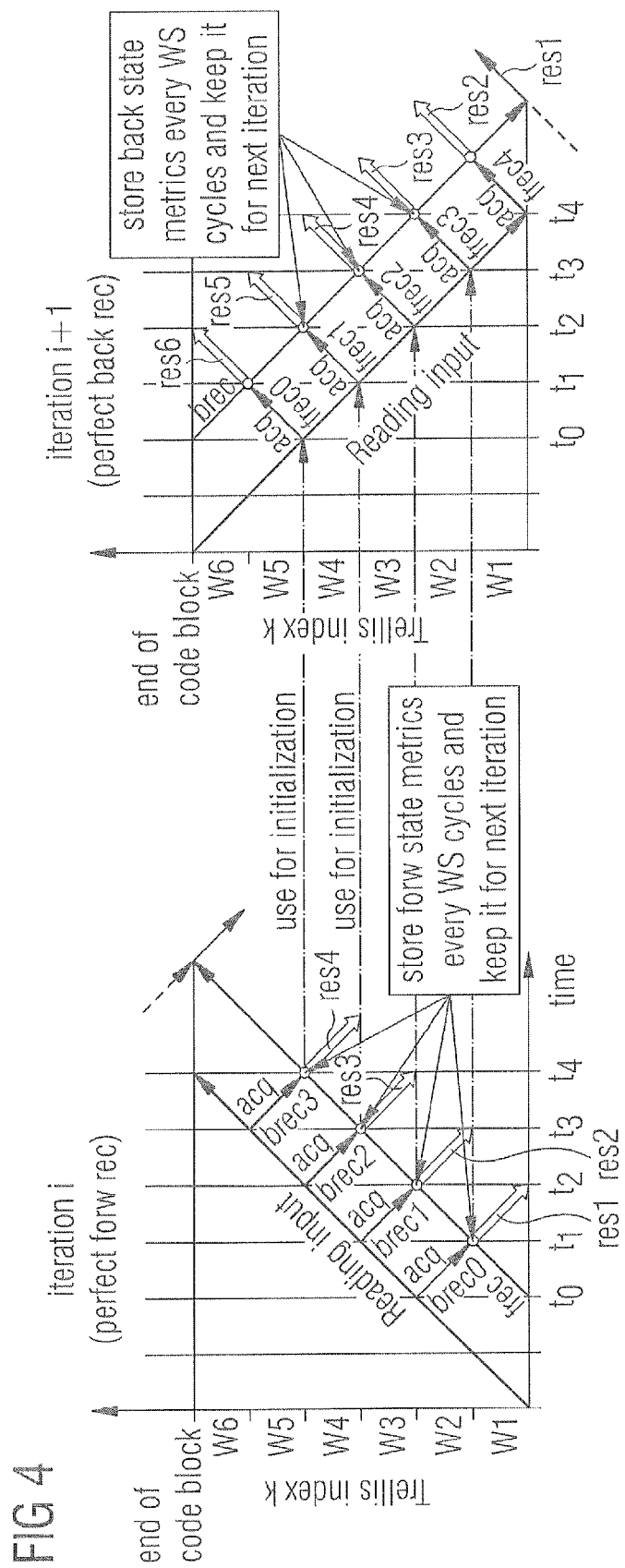
FIG. 4 is a diagram schematically illustrating a decoding scheduling of a continuous forward recursion and an intermittent backward recursion in a given iteration and a continuous backward recursion and an intermittent forward recursion in a later iteration using a sliding window decoding scheme.

The left hand side of FIG. 4 illustrates an embodiment of scheduling the forward and backward recursions frec, brec in a first decoding iteration i using a window-based approach. During the symbol estimation process, both recursions frec, brec must be carried out in order to calculate the reliability information sequence (LLRs) provided at the decoder output 5. The sliding-window approach comprises the recursion runs being carried out window-by-window. The position of the window is then shifted in steps over the entire code block (or, in parallel decoder architectures, over the entire code sub-block).

More specifically, as shown in the left hand side of FIG. 4, the code block (or code sub-block) is divided into windows W1, W2, . . . . Each window may have the same size WS, and typically, the window size WS is smaller than the code block size (or the code sub-block size).

The forward recursion frec starts at time $t_0$ at the beginning of the initial window W1. At the same time $t_0$, an acquisition phase of the first backward recursion brec0 is started. At time $t_1$, the forward recursion frec reaches the end of the initial window W1 and the acquisition phase of the first backward recursion brec0 ends. Between time $t_1$ and time $t_2$, the continuous forward recursion frec is continued to process the second window W2 and the first backward recursion brec0 is continued to operate on the first window W1. During the time interval $t_1$ to $t_2$, decoding results res1 (i.e. LLRs) for the first window W1 are computed and output.

This process is continued until the last window of the code block (or code sub-block) is reached and decoded. Thus, while the forward recursion frec is operated continuously over the entire code block (or code sub-block), the backward recursions brec0, brec1, brec2, . . . are scheduled intermittently to calculate the backward metrics and decoding results res1, res2, res3, . . . for window W1, W2, W3, . . . , respectively.

It is to be noted that the acquisition phases of the window-based backward recursions brec0, brec1, brec2, . . . may have variable length. In FIG. 4, by way of example, they are chosen to have the length of window size WS. However, in general, the acquisition phase of the backward recursions brec0, brec1, brec2, . . . does not need to be of the same size as the windows. The acquisition phase may be greater than WS in order to increase the reliability of the backward metrics calculation in each window or may be shorter than WS. As will be described in more detail further below, in one embodiment, an acquisition phase of the backward recursions brec0, brec1, brec2, . . . may be omitted, i.e. the backward recursions brec0, brec1, brec2, . . . may be designed without acquisition phase.

The quality of the backward metrics computation depends on the length of the acquisition phase and on the initialization of the window-wise backward recursions. More specifically, the state metric initialization values used at the beginning of the backward recursions brec0, brec1, brec2, . . . (i.e. at the start of the acquisition phase, if any) have an influence on the reliability of the backward state metrics calculated in the backward recursion after the acquisition phase. Initialization of the backward recursions brec0, brec1, brec2, . . . is indicated in FIG. 4 by an arrow labeled "Reading input". In general, due to the termination bits which force the trellis path to return to a predetermined state at the end of the code block, only the state metric of the last window (here: W6) of the code block (or last code sub-block) is reliably initialized. On the contrary, for all other windows (here: W1-W5), deterministic state metric initializations of the backward recursions are not possible. This implies that losses in performance of the sliding-window approach as shown in the left hand portion of FIG. 4 depend on the initialization of the backward state metrics of all but the last code block (or code sub-block).

Figure 5:
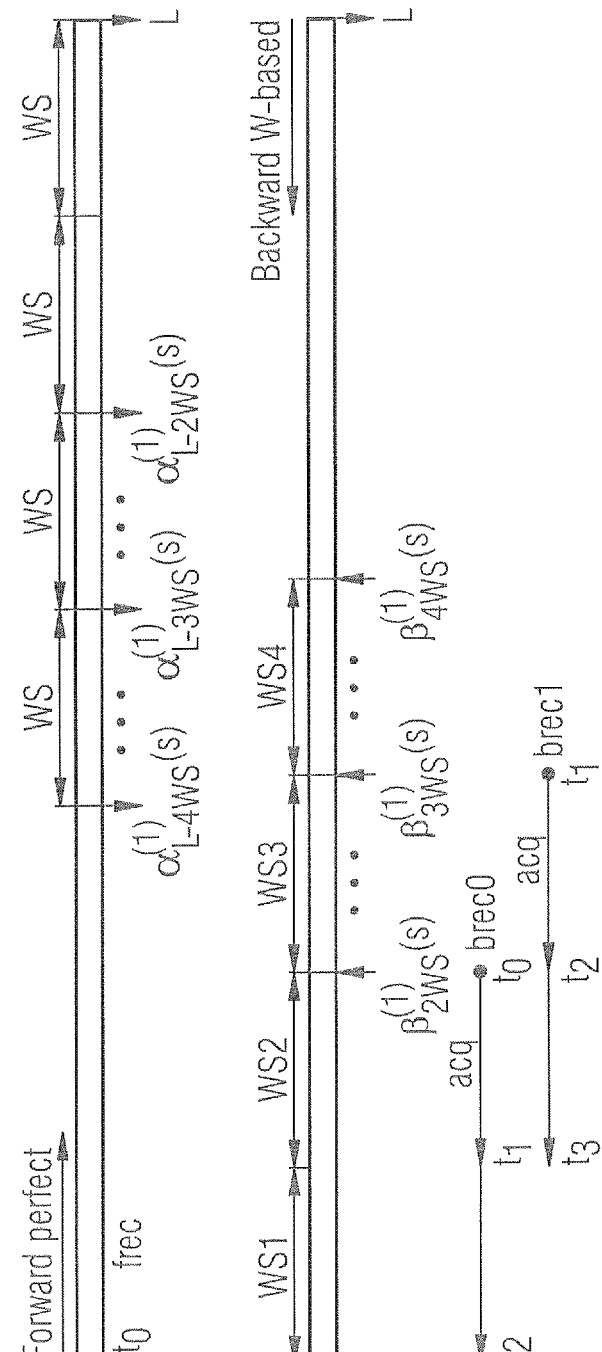
FIG. 5 is a timing diagram schematically illustrating the decoding process in a given iteration such as, e.g., the one shown in the left hand portion of FIG. 4.

FIG. 5 illustrates the scheduling of the "perfect" forward recursion and window-based backward recursions in iteration i as shown in the left hand portion of FIG. 4. L is the code block size, S is the number of trellis states, and s=1, . . . , S denotes the trellis state index. The perfect forward recursion frec starts deterministically at $t_0$ and runs continuously over the entire code block (indices 1 to L). At the border of the windows, mWS, m=1, 2, . . . , L/WS, the forward state metrics $\alpha_{WS}^{(i)}(s), \alpha_{2WS}^{(i)}(s), \ldots, \alpha_{L-WS}^{(i)}(s), \alpha_L^{(i)}(s)$ are stored. The window-based backward recursions brec0, brec1, . . . start at $t_0$ and $t_1$, respectively, and run each over one acquisition window and one metrics calculation window as explained above. To this end, brec0 is initialized with state metrics $\beta_{2WS}^{(i)}(s)$ and brec1 is initialized with state metrics $\beta_{3WS}^{(i)}(s)$. Without loss of generality, i=1 in FIG. 5. In this case, as no initialization information is available at this initial stage, the border state metrics of the backward recursions (e.g. at the beginning of the acquisition windows, if any) are equiprobably initialized by $\beta_{mWS}^{(1)}(s)=1/S$. Note that if a parallel decoding architecture is used, the above scheme applies for a code sub-block and L is the code sub-block size.

The diagram in the right hand portion of FIG. 4 illustrates the scheduling of forward and backward recursions in the next decoding iteration i+1. In the next iteration i+1, the forward and backward recursions are interchanged. As a consequence, the backward recursion is now performed continuously over the entire code block (or, if a parallel decoding architecture is used, over a code sub-block), and the forward recursion frec is window-based, i.e. performed discontinuously over the entire code block (or, if a parallel decoding architecture is used, over a code sub-block). Thus, during iteration i+1, the backward recursion is performed "perfectly" while the forward recursion is performed window-based or "imperfectly" and hence, it might cause the loss in performance.

Generally speaking, the forward and backward recursions are rescheduled from iteration i to iteration i+1. The recursion which is performed "perfectly" and the "imperfect" recursion may be exchanged from iteration i to iteration i+1. More specifically, whilst the recursion which is performed "perfectly" is run in the direction of increasing trellis indices k in iteration i, it is run in the direction of decreasing trellis indices k in iteration i+1. Vice versa, whilst the recursion which is performed "imperfectly" is run in the direction of decreasing trellis indices k in iteration i, it is run in the direction of increasing trellis indices k in iteration i+1. Thus, the forward/backward decoding scheme used in iteration i and the forward/backward decoding scheme used in iteration i+1 are different in view of forward and backward processing. In particular, these decoding schemes may be inverse in view of forward and backward processing.

In one embodiment, the state metrics estimated during a previous iteration i are used in the next iteration i+1 for initializing the "imperfect" window-based recursions. If the window-based recursions contain an initial acquisition phase, it is the acquisition phase of the window-based recursions which is initialized by the state metrics of same recursion type (i.e. forward or backward) estimated and stored in the previous iteration i.

More specifically, as shown in the left hand portion of FIG. 4 at times $t_2$, $t_3$, and $t_4$, forward state metrics calculated during the "perfect" forward recursion in iteration i are stored and kept for the next iteration i+1. In next iteration i+1, at $t_0$ a continuous backward recursion brec is started and, concurrently, a first window-based forward recursion frec0 is started.

It is to be noted that the start time $t_0$ of the first forward recursion frec0 depends on the length of the acquisition phase. If the acquisition phase is longer than WS, the window-based forward recursion frec0 is started earlier, otherwise, if the acquisition phase is shorter than WS, the forward recursion frec0 is started later—it may even be started at $t_1$, if the first window-based forward recursion frec0 is implemented without acquisition phase. This applies to all forward recursions frec0, frec1, frec2, ... operated in iteration i+1.

Without loss of generality and for ease of explanation, it is assumed in the following that the acquisition phase of the window-based recursions (forward or backward) is equal to window size WS. The scheduling of the decoding depicted in FIG. 4 applies to this case. Then, forward state metrics stored at time $t_4$ during iteration i are used for initialization of the window-based forward recursion frec0 in iteration i+1 started at time $t_0$.

In iteration i+1 at time $t_0$ the first forward recursion frec0 is continued in window W6 and concurrently, decoding results res6 (LLRs) for window W6 are calculated. This scheme is continued as depicted in the right hand portion of FIG. 4. That is, at $t_1$, $t_2$, and $t_3$ the window-based forward recursions frec1, frec2 and frec3, respectively, are initialized by forward state metrics stored in iteration i at times $t_3$, $t_2$, and $t_1$, respectively, and decoding results res5, res4, res3 are calculated.

Figure 6:
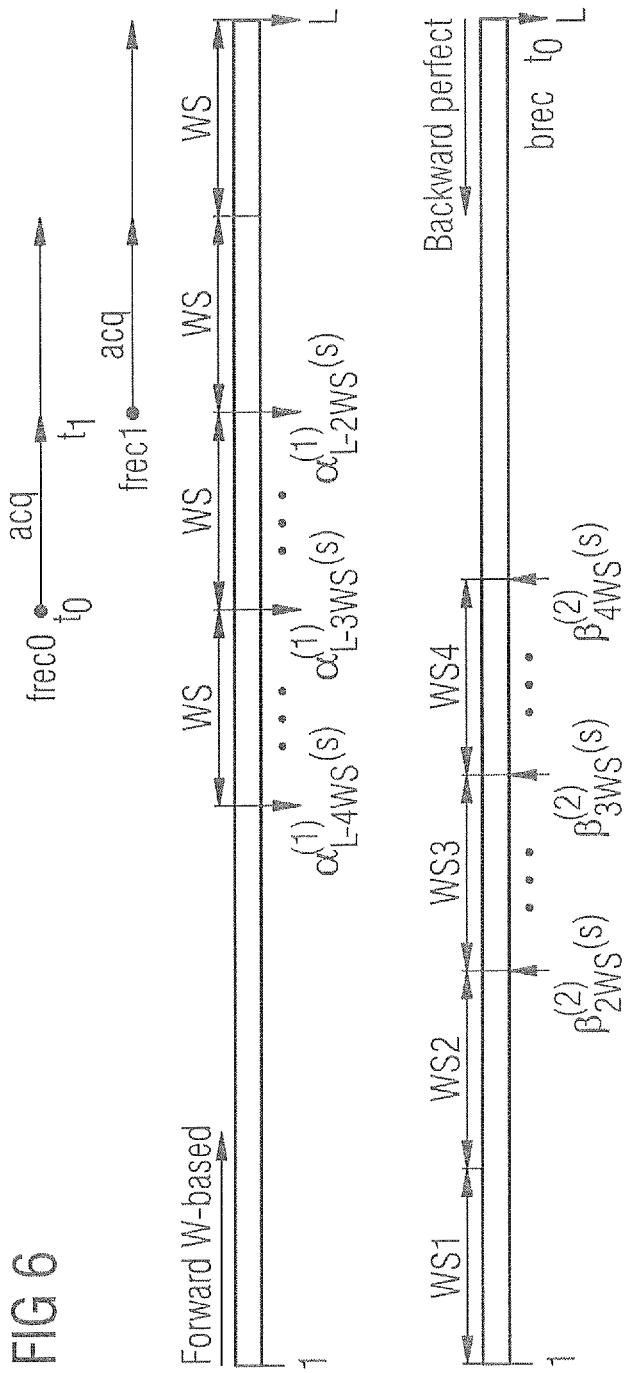
FIG. 6 is a timing diagram schematically illustrating the decoding process in a later iteration such as, e.g., shown in the right hand portion of FIG. 4.

FIG. 6 illustrates the scheduling of the "perfect" backward and window-based forward recursions in iteration i+1 as illustrated in the right hand portion of FIG. 4. The backward recursion brec starts deterministically at the end of code block L at $t_0$ and runs continuously over the entire code block (or code sub-block) in backward direction (indices L to 1). At the border of the windows, L-mWS, m=1, ..., L/WS, the backward state metrics $\beta_{L\text{-}WS}^{(i+1)}(s), \ldots, \beta_{2WS}^{(i+1)}(s), \beta_{WS}^{(i+1)}(s)$ are stored. The window-based forward recursions frec0, frec1, ... start at $t_0$ and $t_1$, respectively, and run each over one acquisition window and one metrics calculation window as explained above. To this end, frec0 is initialized with state metrics $\alpha_{L\text{-}2WS}^{(i)}(s)$, frec1 is initialized with state metrics $\alpha_{L\text{-}3WS}^{(i)}(s), \ldots$ and so on. Without loss of generality, i=1 in FIGS. 5 and 6.

Due to the concept of changing the decoding scheme from iteration i to iteration i+1 in view of recursion directions, the state metrics used for initialization of an "imperfect" window-based recursion in iteration i+1 are calculated in iteration i on the basis of a "perfect" continuous recursion. Therefore, the next iteration initialization (NII) technique as applied in one embodiment is always based on highly reliable state metric data.

Iteration i+2 is may then be performed according to the decoding scheme used in iteration i. That is, the forward recursion is again continuous and "perfect", and refined forward state metrics for subsequent iterations are saved. The backward recursion is again window-based and "imperfect", but highly reliable backward state metrics from a previous "perfect" backward recursion are available to initialize the border state metrics at the acquisition phases of the backward recursions. In other words, in iteration i+2, the NII approach may again be applied and uses the backward metrics stored in the "perfect" backward recursion in previous iteration i+1.

In one embodiment the variation of the forward/backward decoding scheme is not performed every iteration. By way of example, it is possible to process a first number of iterations according to a first decoding scheme (e.g. as exemplified in the left hand portion of FIG. 4) and a second number of iterations according to a second decoding scheme (e.g. as exemplified in the right hand portion of FIG. 4) which is interchanged or inverse in view of the scheduling of forward and backward recursions to the first decoding scheme. By way of example, variations or inversions of the decoding schemes could be performed every 2, 3, ... iterations. Also in this case, forward/backward state metrics computed according to the first decoding scheme may be used for initialization of forward/backward recursions processed according to the second decoding scheme.

Further, even if the decoding scheme is varied or inverted iteration-by-iteration, it is to be noted that the forward/backward metrics used for initialization in an actual iteration do not necessarily need to be computed and stored during the preceding iteration. It is also possible that forward/backward metrics which are computed and stored a plurality of iterations earlier are used in an actual iteration. Also in this embodiment, the forward/backward metrics used in an actual iteration have been computed during an earlier iteration in which the different or inverse (in view of the scheduling of forward and backward recursions) decoding scheme was operated. As a result, also in this case a "perfect" recursion is exploited to generate reliable state metrics for initialization of the "imperfect" actual recursion.

By using the proposed solution, forward and backward recursions are always performed almost perfectly. In fact, apart from the first iteration (where, for the window-based recursion, the state metrics of the acquisition windows are equiprobably initialized), the window-based recursion is initialized with perfectly computed state metrics from a previous iteration. Even though these values are computed at a previous iteration, which causes a little lack in reliability, it is possible to show that this lack almost disappears after a few iterations.

It is to be noted that the combination of decoding scheme variation with next (or later) iteration initialization during iterative decoding significantly reduces the dependency of the performance on the window size, i.e. smaller window sizes (or smaller acquisition lengths) can be chosen for the combined scheme compared to known schemes to achieve the same performance. A small window size (e.g. 20-130, more specifically 20-70, still more specifically 20-40) can be used to achieve performance near the performance available with the non-window-based Max-Log-MAP algorithm for practical code rate 0.98). Small window sizes can drastically reduce the required memory space of the iterative decoder.

Further, the concepts explained above allow to use very short acquisition phases even for high code rates. The shorter the acquisition phase, the less computational effort and power consumption is needed. As mentioned earlier, it may even be possible to eliminate an acquisition phase in the window-based recursion.

In one embodiment a multiple worker (e.g. multiple computation units such as multiple processors) implementation is used. Multiple workers are especially useful for high throughput solutions. When multiple workers are considered, the code block is sub-divided into adjacent code sub-blocks of data. Each worker processes one sub-block in parallel with the other workers, and the sub-blocks may be considered as independent codeword segments within an iteration. Multiple worker solutions are implemented by parallel decoder architectures in which the iterative decoder structure for each worker is identical to the one described above for a single worker. That is, according to one or more embodiment, each worker may use iterative decoder 100 and/or iterative decoder 200 as illustrated in FIGS. 1 and 2, and decoding schemes as illustrated in FIGS. 3 to 6.

Figure 7:
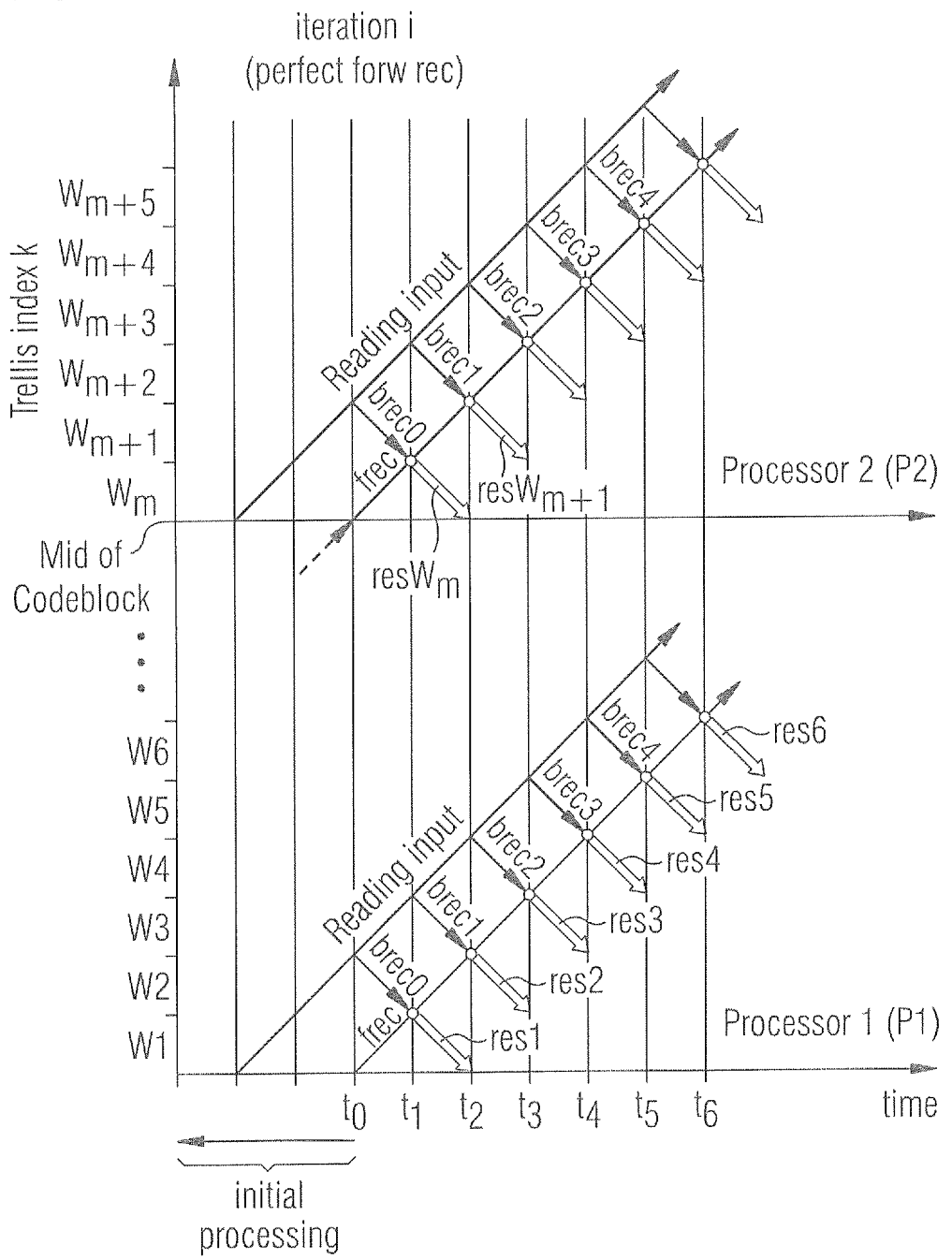
FIG. 7 is a diagram schematically illustrating a scheduling of 2 workers in a window-based parallel decoding scheme according to one embodiment.

More specifically, in one embodiment illustrated in FIG. 7, the scheduling of forward and backward recursions using the sliding-window approach is shown by way of example for two workers (processor P1 and processor P2). The diagrams shown in FIG. 7 correspond to iteration i as shown in the left hand portion of FIG. 4. However, in contrast to the single worker solution of FIG. 4, the first worker (processor P1) operates on the first half of the code block (lower part of FIG. 7) and the second worker (processor P2) concurrently operates on the second half of the code block (upper part of FIG. 7). Thus, the code block is divided in two code sub-blocks. The first code sub-block is divided into windows W1, W2, ..., whereas the second code sub-block is divided into windows $W_m$, $W_{m+1}$, .... Each window may have the same size WS, and typically, the window size WS is smaller than the code sub-block size NS, i.e. WS<NS.

In iteration i iterative decoding uses a "perfect" continuous forward recursion and an "imperfect" window-based backward recursion for both workers P1, P2. For the sake of brevity and in order to avoid reiteration, reference is made to the description of the corresponding decoding scheme illustrated in the left hand portion of FIG. 4. The only difference is represented by the edges of each sub-block. Similar to the initialization of each window for the window-based recursion in the single worker case, in the multiple worker case also the edge state metrics of the sub-blocks should be reliably initialized, e.g. by state metrics computed in a previous iteration operating on a different or inverse (in view of the scheduling of forward and backward recursions) decoding scheme. However, the last backward recursion of the last (i.e. uppermost) code sub-block is deterministically initialized similar to the single worker case.

In the embodiment shown in FIG. 7, by way of example, the scheduling of forward and backward recursions for each worker is the same for a given iteration i, i.e. the "perfect" recursion is performed for each worker in the same direction for a given iteration i. However, in one embodiment, for a given iteration i, for one worker the "perfect" iteration may be performed and for another worker the "imperfect" iteration of inverse direction may be performed.

Decoding scheme variation from iteration i to iteration i+1 (or, more generally, from a previous iteration to a later iteration) may be performed in the same way as described above with respect to the one worker solution. Further, the storage of state metrics computed in a "perfect" continuous recursion and the use of these stored state metrics in a later "imperfect" window-based recursion of the same type correspond to the aforementioned techniques used in the single worker solution. In this respect, all features and embodiments disclosed for the single worker solution may likewise be applied to the multiple worker solution.

Figure 8:
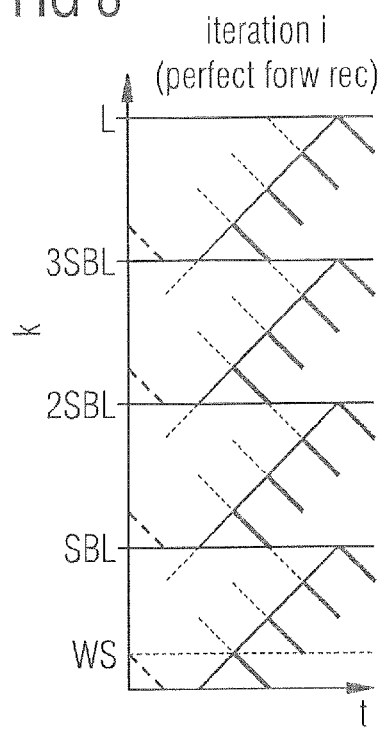
FIG. 8 is a diagram schematically illustrating a scheduling of 4 workers in a window-based parallel decoding scheme according to one embodiment.

FIG. 8 is a schematic illustration of a decoding scheme applied in iteration i (perfect forward recursion, window-based backward recursion) for a four worker scenario. The code block of length L is divided into four code sub-blocks of length SBL, and each code sub-block is again divided into several windows of length WS. Each code sub-block is processed independently by a dedicated worker (processor), i.e. an iterative decoder 100, 200 as explained earlier. The acquisition phases are indicated by dotted lines and may be omitted if desired. Thick lines indicate that LLR output calculations are performed. Again, the iterative decoding process for one, multiple or each code sub-block(s) may comprise the concepts of decoding scheme variation and NII using state metrics computed in "perfect" recursions according to all single and multiple worker embodiments described before.

Figure 9:
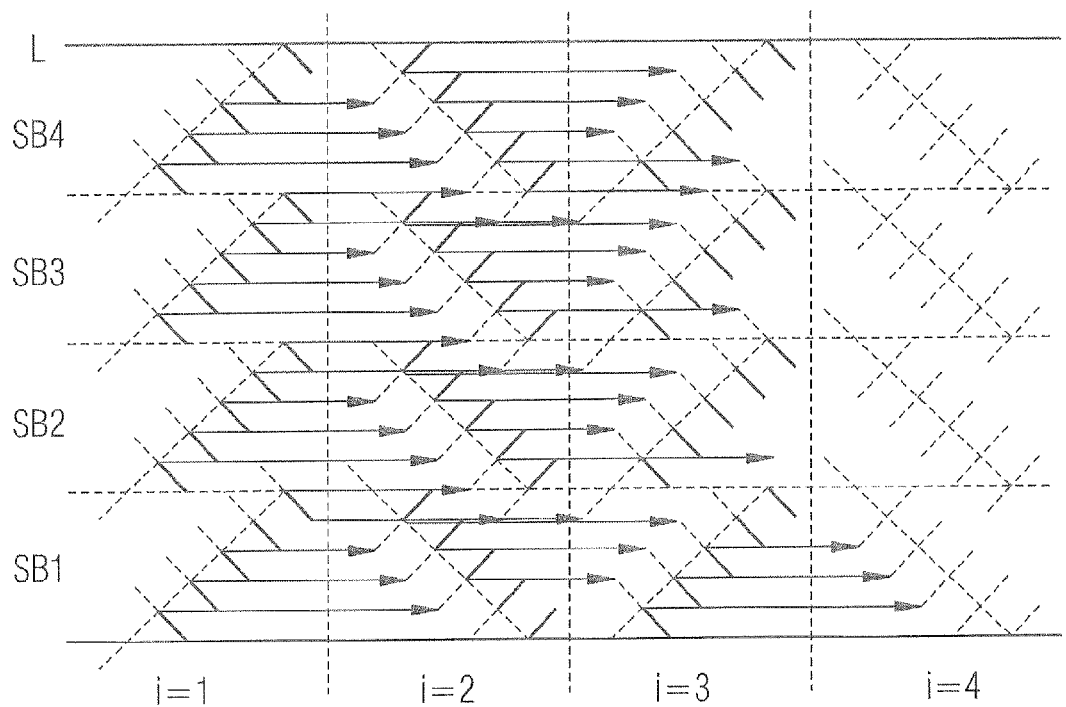
FIG. 9 is a diagram schematically illustrating a scheduling of 4 workers in a window-based parallel decoding scheme according to one embodiment.

FIG. 9 is a schematic illustration of one embodiment of a decoding scheme applying perfect forward and window-based backward recursions in odd-numbered iterations 1, 3, . . . and window-based forward and perfect backward recursions in even-numbered iterations 2, 4, . . . for a four worker scenario. Similar to the embodiment shown in FIG. 8, the code block of length L is divided into four code sub-blocks of length SBL denoted by SBx, x=1, . . . , 4, and each code sub-block SBx is again divided into several (here: 5) windows of length WS. Each code sub-block SBx is processed independently by a dedicated worker (processor), i.e. an iterative decoder 100, 200 as explained earlier. The acquisition phases are indicated by dotted lines and may be omitted if desired.

The iterative decoding process for one, multiple or each code sub-block(s) SBx may comprise the concepts of decoding scheme variation and NII. In iteration i=1, a decoding scheme similar to the decoding scheme illustrated in FIG. 8 is applied. In later iteration (here: i=2), an inverse decoding scheme in view of forward/backward processing is applied. That is, the backward recursion is continuous ("perfect") and the forward recursion is window-based ("imperfect"). Further, state metrics computed in "perfect" recursions are used to initialize "imperfect" recursions in the later iteration. This may apply to single and multiple worker embodiments, as described before.

In one embodiment, only one acquisition unit is used. By way of example, as illustrated in FIG. 9, the acquisition unit is used for backward recursions for odd iterations and for forward recursions for even iterations.

As mentioned earlier, the meaning of the term NII as used throughout the description may also comprise "later iteration initialization", i.e. in general, the iteration which is initialized is either the next or a later iteration.

In one embodiment, the NII concept may further comprise the initialization of multiple iterations. By way of example, in FIG. 9, the concept of multiple iteration initialization is illustrated by the horizontal double arrows starting at i=1 and pointing to i=2 and i=3. More specifically, forward state metrics computed at i=1 for the uppermost windows in code sub-blocks SBx, x=1, 2, 3 are used to initialize a window-based forward recursion in code sub-block SBx+1 at i=2 and a "perfect" forward recursion in code sub-block SBx at i=3.

In one embodiment, code sub-blocks SBx of different x may be processed by using different decoding schemes. By way of example, at i=1, code sub-blocks SB1 and SB3 may be processed as shown in FIG. 9 at i=1 (i.e. "perfect" forward, "imperfect" backward recursion), whereas code sub-blocks SB2 and SB4 may be processed at i=1 as shown in FIG. 9 at i=2 (i.e. "perfect" backward, "imperfect" backward recursion).

Figure 10:
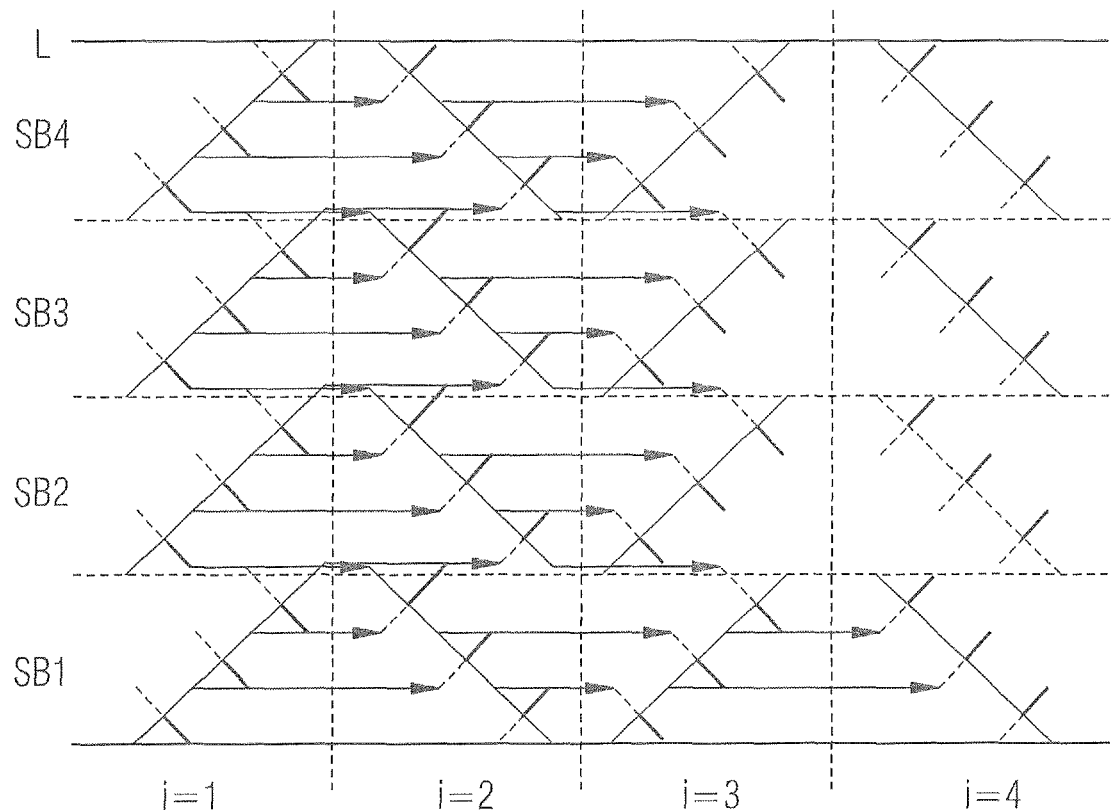
FIG. 10 is a diagram schematically illustrating a scheduling of 4 workers in a window-based parallel decoding scheme according to one embodiment.

FIG. 10 is a schematic illustration of one embodiment of a decoding scheme. Again, (optional) acquisition phases are indicated by dotted lines and NII is indicated by horizontal arrows. Here, by way of example, an X-structured window scheme is applied. Each X extends over two windows. The first X to be processed is the X associated with the lowermost two windows in each code sub-block SBx. A forward recursion is started at the bottom of the first window of the X and a backward recursion is stated at the top of the second window of the X. The computed state metrics are stored over the windows and then, decoding results (LLRs) are computed for the other window once the forward and backward recursions meet (i.e. at the intersection of the X). Once the two windows associated with the first X are processed, the X-structure is shifted to the next two windows. In FIG. 10, by way of example, each code sub-block SBx comprises 6 windows, i.e. 3 X-structures are processed per code sub-block SBx.

In FIG. 10, at later iteration i=2, a different decoding scheme in view of forward and backward processing is applied. Also at i=2, the X-structured decoding scheme as described above is used. However, the first X-structure which is processed is the X-structure associated with the uppermost two windows in each code sub-block. Thus, the scheduling of forward and backward recursions, or, in other words, the decoding direction is inverted from i=1 to i=2.

In one embodiment, the first decoding schemes used in a first iteration and the second decoding scheme used in a second iteration are different in view of the structure of the decoding schemes. By way of example, in a first iteration, a first decoding scheme of a first structure such as the ladder-structure scheme illustrated in FIGS. 4, 7, 8, 9 (i.e. one continuous recursion, several window-based recursions of inverse direction) is used, and in a second iteration, a second decoding scheme of a second structure such as the X-structure scheme illustrated in FIG. 10 is used. The structure of a decoding scheme is indicative of the scheduling pattern of processing forward and backward recursions over code sub-blocks or code blocks. Also in this embodiment, the first decoding scheme used in a first iteration and the second decoding scheme used in a second iteration are different, and acquisition and NII may be applied.

Figure 11:
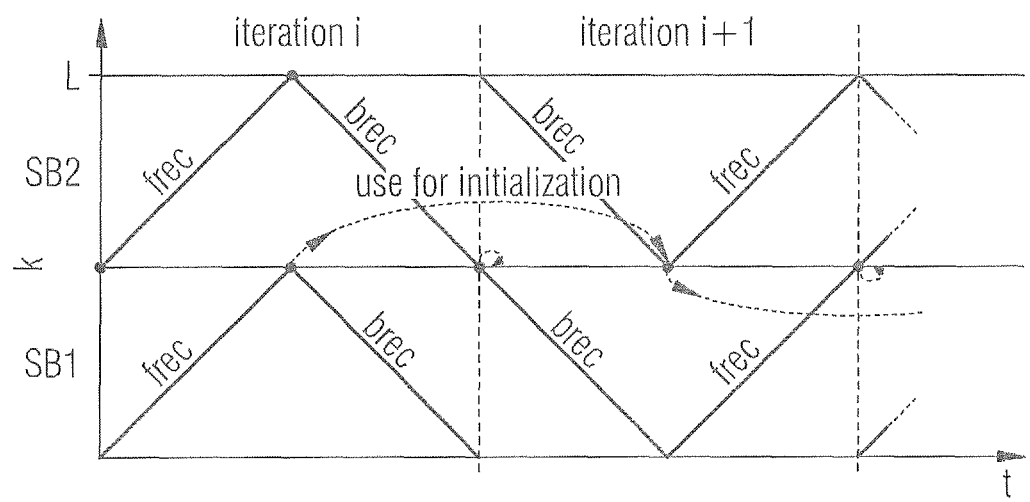
FIG. 11 is a diagram schematically illustrating a decoding scheduling of multiple workers in a non window-based parallel decoding scheme.

FIG. 11 is a diagram illustrating a multiple worker decoding scheme according to one embodiment. Here, similar to FIG. 7, two workers are considered, that is the code block is divided into two code sub-blocks SB1, SB2. In contrast to the multiple worker embodiments illustrated in FIGS. 7 and 8, a non-window-based decoding algorithm is used. By way of example, a non-window-based decoding algorithm as explained in conjunction with FIG. 3, using a continuous forward recursion and a continuous backward recursion, may be used.

More specifically, in iteration i a first continuous forward recursion frec and a subsequent continuous backward recursion brec are operated by both workers (e.g. processors). In iteration i+1 the decoding scheme is varied or, more specifically inverted in view of forward and backward processing, i.e. the recursion directions are interchanged. Thus, in iteration i+1 a first continuous backward recursion brec and a subsequent continuous forward recursion frec are operated.

Here, the variation of the decoding scheme from iteration i to iteration i+1 allows the recursion in iteration i+1 to be initialized as follows. The backward recursion brec in sub-block SB2 is deterministically initialized thanks to the termination bits at the end of the code block. The backward recursion brec in sub-block SB1 is a mere continuation of the backward recursion brec of sub-block SB2 in iteration i and is therefore perfectly initialized. The forward recursion frec in sub-block SB2 is initialized by using forward metrics computed and stored at the end of the forward recursion frec in sub-block SB1 in the preceding iteration i. Finally, the forward recursion frec in sub-block SB1 is deterministically initialized as the initial trellis state is known. Thus, even in the case if a non-window-based decoding scheme, the concept of decoding scheme variation (e.g. inversion) from one iteration to another iteration may considerably improve the decoding performance.

In one embodiment the decoding scheme used in iteration i+2 is identical to the decoding scheme used in iteration i, i.e. the inversion of the decoding scheme is performed iteration-by-iteration. In this case, in iteration i+2, the forward recursion frec in sub-block SB2 is a mere continuation of the forward recursion frec in sub-block SB1 in previous iteration i+1, and the backward recursion in sub-block SB1 is initialized by backward metrics computed by the backward recursion brec in sub-block SB2 in iteration i+1 at the lowest trellis index of sub-block SB2.

Thus, in one embodiment state metrics computed in a recursion for sub-block SB1 in iteration i are used to initialize a recursion in sub-block SB2 in a later iteration (e.g. next iteration i+1), and state metrics computed in a recursion in sub-block SB2 in iteration i are used to initialize a recursion in sub-block SB1 in a later iteration (e.g. next iteration i+1). In other words, the recursion scheme variation during iterative decoding may result in that sub-blocks are no longer decoded independently of each other. In contrast, state metric information is exchanged between sub-blocks from one iteration to another iteration.

It is to be noted that all features described herein in the context of decoding a code block in single worker solutions may be applied to decoding a code sub-block in multiple worker solutions. Further, all features described herein in the context of decoding a code sub-block in multiple worker solutions may be used for decoding a code block in single worker solutions.

Figure 12:
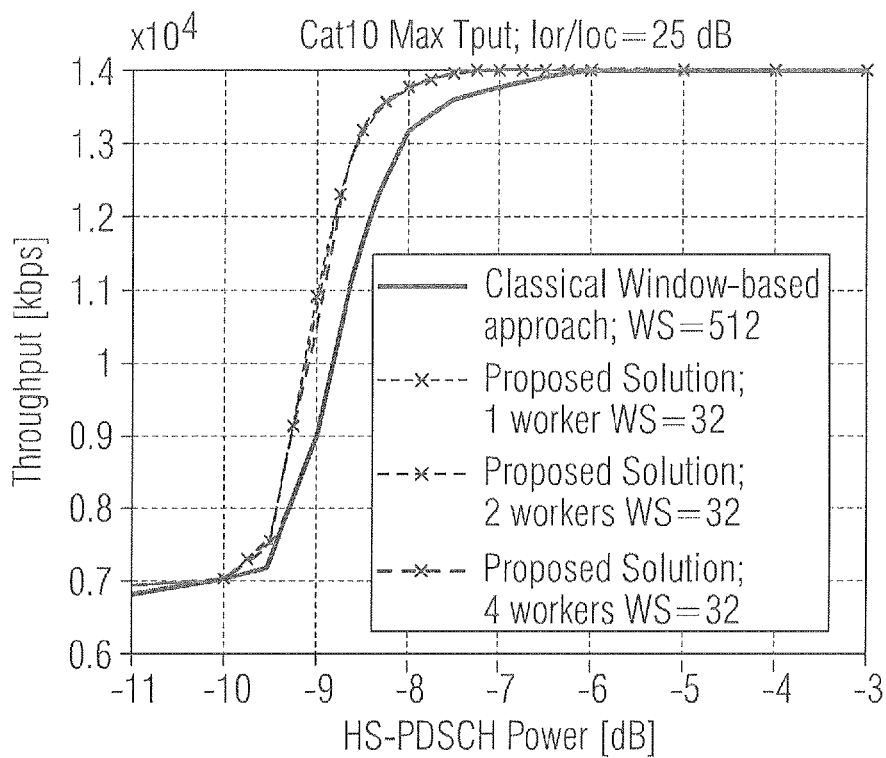
FIG. 12 is a graph showing the decoder throughput plotted versus the signal power of the conventional window-based approach for 1 worker and the window-based recursion scheme inversion approach for 1, 2 and 4 workers.

FIG. 12 is a graph illustrating the throughput of an iterative decoder in units of kbps versus the channel power in units of dB. By way of example, the HS-PDSCH channel was considered. A turbo-decoder as shown in FIG. 2 was used, and a window-based decoding scheme as illustrated in FIGS. 4 to 8 was employed. That is, decoding scheme inversion and state metrics exchange was used in each iteration. A small window size WS=32 was elected and an acquisition phase of length WS=32 was used. A typical scenario (Cat10, MaxTput and lor/loc=25 dB) was used and simulation results were generated for one worker, two workers and four workers. On the other hand, for the classical window-based approach, where no decoding scheme variation and no NII is used, a window size WS=512 was used and only the single worker case was considered. As can be seen from FIG. 12, the proposed solution outperforms the classical window-based solution irrespective of the degree of parallelism (1, 2, 4 workers). In addition there are almost no losses in performance as the number of workers increases.

Figure 13:
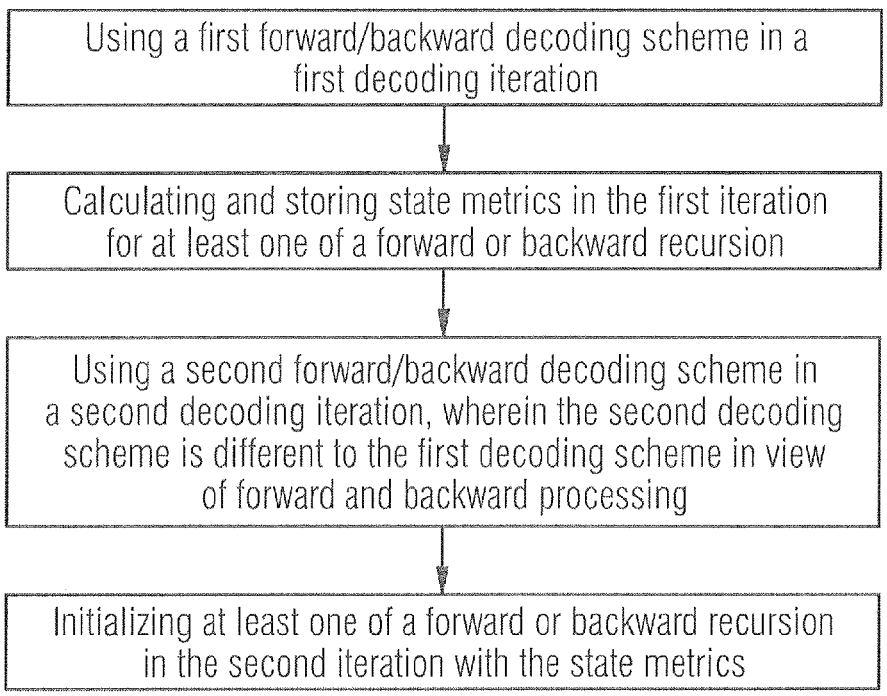
FIG. 13 is a flowchart of a method of decoding a code block according to one embodiment.

FIG. 13 is a flowchart of a method of iteratively decoding a concatenated code according to one embodiment. In a first iteration, a first forward/backward decoding scheme is used. In this iteration, state metrics for at least one of the forward or backward recursion are calculated and stored. In a second iteration, a second forward/backward decoding scheme is used, wherein the second decoding scheme is different to the first decoding scheme in regard of forward and backward recursion processing. In this second iteration, the state metrics calculated and stored in the first iteration are used to initialize the at least one of the forward or backward recursion. As was mentioned earlier, both recursions may be continuous recursions or at least one of the recursions may be an intermittent window-wise recursion. Further, the recursions may run over the entire code block (one worker solution) or the recursions may each run over code sub-blocks (multi worker solution).

In general, in one or more embodiments described herein, the required storage memory space may be substantially reduced resulting in chip area and power consumption reduction of the chip set. In this respect, it is to be noted that the reduction in window size WS does not only allow to reduce the amount of state metrics to be stored, but also determines the cache sizes for branch metrics, read/write addresses, etc.

Further, the design of the window size WS may thus be chosen to be considerably smaller than in conventional designs.

Still further, latency may be reduced. The initial latency at each iteration in most window-based algorithms is a multiple of window size WS. Therefore, the overall decoding latency may also be significantly reduced by the concepts described herein compared to conventional solutions that use larger window sizes WS to attain the same BLER TPut performance (BLER: block error rate; TPut: throughput). Alternatively, for a given decoding latency, a window size reduction leads to a smaller required clock rate of the decoding hardware which is beneficial in terms of chip area and power consumption.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. This application is intended to cover any adaptations or variations of the specific embodiments discussed herein, and the invention is intended to be limited only by the claims and the equivalence thereof.

The invention claimed is:

1. An iterative decoder for decoding a code block, comprising:
   a computation unit configured to perform forward and backward recursions over a code block or a code sub-block in each decoding iteration, wherein a first forward/backward decoding scheme is used in a first iteration and a second forward/backward decoding scheme is used in a second iteration,
   wherein the first and second decoding schemes are different in view of forward and backward processing and the second iteration is later than the first iteration.

2. The iterative decoder of claim 1, wherein the computation unit is configured to use state metric values calculated in the first iteration for initializing one of a forward or backward recursion in the second iteration.

3. The iterative decoder of claim 2, wherein the computation unit is configured to use the state metric values for initializing an acquisition phase of the one of a forward or backward recursion.

4. The iterative decoder of claim 2, wherein the computation unit is configured to use in the first iteration state metric values calculated in a previous iteration for initializing a forward recursion and to use in the second iteration state metric values calculated in the first iteration for initialization a backward recursion.

5. The iterative decoder of claim 1, wherein the first forward/backward decoding scheme comprises running one of the forward or backward recursions continuously over the code block or code sub-block and the other of the forward or backward recursions discontinuously over a plurality of window sections of the code block or code sub-block.

6. The iterative decoder of claim 1, wherein the first forward/backward decoding scheme comprises running the forward and the backward recursions continuously over the code block or code sub-block.

7. The iterative decoder of claim 1, wherein
   the iterative decoder comprises at least a further computation unit,
   the code block is partitioned in at least a first and a second code sub-block, and
   each computation unit is configured to perform forward and backward recursions on a specific one of the first and second code sub-block.

8. The iterative decoder of claim 7, wherein each computation unit is configured to use state metric values calculated by the other computation unit in a previous iteration.

9. The iterative decoder of claim 1, wherein the code block is a turbo code block.

10. An iterative decoder for decoding a code block, comprising:
    a computation unit configured to perform forward and backward recursions over the code block or a code sub-block in each decoding iteration, wherein a scheduling of forward and backward recursions is varied from one iteration to a later iteration, wherein forward and backward recursions are interchanged from the one iteration to the later iteration, and
    a memory in which state metric values calculated in said one iteration and used for initializing a forward or backward recursion in said later iteration are stored.

11. The iterative decoder of claim 10, wherein in the one iteration the forward recursion runs continuously over the code block or code sub block and the backward recursion is window-based, and in the later iteration the forward recursion is window-based and the backward recursion runs continuously over the code block or code sub block.

12. The iterative decoder of claim 10, wherein the usage of an acquisition phase of forward and backward recursions is flipped from said one iteration to said later iteration.

13. A method of decoding a code block by iteration, comprising:
    performing forward and backward recursions over the code block or a code sub-block in each decoding iteration using a computation unit, comprising:

using a first forward/backward decoding scheme in a first iteration; and using a second forward/backward decoding scheme in a second iteration, wherein the first and second decoding schemes are different in view of forward and backward processing and the second iteration is later than the first iteration.

14. The method of claim 13, further comprising:

calculating state metric values in the first iteration for at least one of a forward or backward recursion; and initializing at least one of a forward or backward recursion in the second iteration with the state metric values.

15. The method of claim 14, wherein an acquisition phase of the one of a forward or backward recursion is initialized with the state metric values.

16. The method of claim 13, further comprising:

initializing a forward recursion in the first iteration by using state metric values calculated in a previous iteration; and initializing a backward recursion in the second iteration by using state metric values calculated in the first iteration.

17. The method of claim 13, further comprising:

running one of the forward or backward recursions continuously over the code block or code sub-block; and running the other of the forward or backward recursions discontinuously over a plurality of window sections of the code block or code sub-block.

18. The method of claim 13, further comprising:

running the forward and the backward recursions continuously over the code block or the code sub-block.

19. The method of claim 13, further comprising:

partitioning the code block in at least a first and a second code sub-block;

performing forward and backward recursions on the first code sub-block; and concurrently performing forward and backward recursions on the second code sub-bock.

20. The method of claim 13, wherein the code block is a turbo code block.

21. A method of decoding a code block by iteration, comprising:

performing forward and backward recursions over the code block or a code sub-block in a first decoding iteration according to a first forward/backward decoding scheme using a computation unit;

calculating state metric values in the first iteration using the computation unit;

storing the state metric values in a memory using the computation unit;

reading the stored state metric values using the computation unit;

initializing a forward or backward recursion in the second iteration by using the state metric values read from the memory using the computation unit;

performing forward and backward recursions over the code block or a code sub-block in the second decoding iteration according to a second forward/backward decoding scheme which is different in schedule to the first decoding scheme using the computation unit;

performing the forward and backward recursions over the code block or code sub-block according to a first decoding scheme in the first iteration;

deriving a second decoding scheme from the first decoding scheme by interchanging backward and forward recursions; and performing the forward and backward recursions over the code block according to the second decoding scheme in the second iteration.

22. The method of claim 21, wherein the second iteration is the next iteration to the first iteration.

23. The method of claim 21, further comprising:

initializing an acquisition phase of a forward recursion in the first iteration by using state metric values calculated in a previous iteration; and initializing an acquisition phase of a backward recursion in the second iteration by using the state metric values calculated in the first iteration.

\* \* \* \* \*